United States Patent
Peng et al.

(10) Patent No.: US 8,288,777 B2
(45) Date of Patent: Oct. 16, 2012

(54) LED PACKAGE STRUCTURE FOR INCREASING HEAT-DISSIPATING AND LIGHT-EMITTING EFFICIENCY AND METHOD FOR MANUFACTURING THE SAME

(75) Inventors: Hsin-Yuan Peng, Xinwu Township, Taoyuan County (TW); Shen-Ta Yang, Taipei (TW); Chia-Tin Chung, Toufen Township, Miaoli County (TW)

(73) Assignee: Paragon Semiconductor Lighting Technology Co., Ltd., Taoyuan County (TW)

( * ) Notice: Subject to any disclaimer, the term of this patent is extended or adjusted under 35 U.S.C. 154(b) by 281 days.

(21) Appl. No.: 12/654,319

(22) Filed: Dec. 17, 2009

(65) Prior Publication Data

US 2011/0057217 A1    Mar. 10, 2011

(30) Foreign Application Priority Data

Sep. 4, 2009   (TW) ................................ 98129942 A

(51) Int. Cl.
*H01L 27/15*   (2006.01)
(52) U.S. Cl. .............. 257/81; 257/95; 257/99; 257/100; 257/676; 257/E25.032

(58) Field of Classification Search ........................ None
See application file for complete search history.

(56) References Cited

U.S. PATENT DOCUMENTS

| | | | |
|---|---|---|---|
| 6,316,822 B1 * | 11/2001 | Venkateshwaran et al. | .. 257/666 |
| 2003/0210213 A1 * | 11/2003 | Wu | ................................ 345/82 |
| 2004/0222427 A1 * | 11/2004 | Hsiung | ........................... 257/79 |
| 2008/0029775 A1 * | 2/2008 | Liu et al. | ......................... 257/98 |
| 2010/0327295 A1 * | 12/2010 | Peng et al. | ...................... 257/88 |

* cited by examiner

*Primary Examiner* — Evan Pert
*Assistant Examiner* — Scott R Wilson
(74) *Attorney, Agent, or Firm* — Rosenberg, Klein & Lee

(57) ABSTRACT

An LED package structure for increasing heat-dissipating and light-emitting efficiency includes a substrate unit, an alloy unit, a light-emitting unit, a conductive unit and a package unit. The substrate unit has a substrate body, a first conductive pad, a second conductive pad and a chip-placing pad. The alloy unit has a Ni/Pd alloy formed on the chip-placing pad. The light-emitting unit has an LED chip positioned on the Ni/Pd alloy of the alloy unit by solidified solder ball or glue. The conductive unit has two conductive wires, and the LED chip is electrically connected to the first conductive pad and the second conductive pad by the two conductive wires, respectively. The package unit has a light-transmitting package gel body formed on the top surface of the substrate body in order to cover the light-emitting unit and the conductive unit.

17 Claims, 3 Drawing Sheets

LED PACKAGE STRUCTURE FOR INCREASING HEAT-DISSIPATING AND LIGHT-EMITTING EFFICIENCY AND METHOD FOR MANUFACTURING THE SAME

BACKGROUND OF THE INVENTION

1. Field of the Invention

The present invention relates to an LED package structure and a method for manufacturing the same, in particular, to an LED package structure for increasing heat-dissipating and light-emitting efficiency and a method for manufacturing the same.

2. Description of Related Art

The invention of the lamp greatly changed the style of building construction and the living style of human beings, allowing people to work during the night. Without the invention of the lamp, we may stay in the living conditions of ancient civilizations.

Various lamps such as incandescent bulbs, fluorescent bulbs, power-saving bulbs and etc. have been intensively used for indoor illumination. These lamps commonly have the disadvantages of quick attenuation, high power consumption, high heat generation, short working life, high fragility, and being not recyclable. Further, the rapid flow of electrons (about 120 per second) through the electrodes of a regular fluorescent bulb causes an unstable current at the onset of lighting a fluorescent bulb, resulting in a flash of light that is harmful to the sight of the eyes. In order to eliminate this problem, a high frequency electronic ballast may be used. When a fluorescent or power-saving bulb is used with high frequency electronic ballast, it saves about 20% of the consumption of power and eliminates the problem of flashing. However, the high frequency electronic ballast is not detachable when installed in a fluorescent or power-saving bulb, the whole lamp assembly becomes useless if the bulb is damaged. Furthermore, because a fluorescent bulb contains a mercury coating, it may cause pollution to the environment when thrown away after damage. Hence, LED lamp or LED tube is created in order to solve the above-mentioned questions of the prior lamp.

SUMMARY OF THE INVENTION

In view of the aforementioned issues, the present invention provides an LED package structure for increasing heat-dissipating and light-emitting efficiency and a method for manufacturing the same. Because a Ni/Pd alloy is formed on the bottom side of solidified solder ball or glue, the solidified solder ball or glue cannot react with a chip-placing pad of a substrate body to form an IMC (Intermetallic Compound) that is brittle during reflow process.

To achieve the above-mentioned objectives, the present invention provides an LED package structure for increasing heat-dissipating and light-emitting efficiency, including: a substrate unit, an alloy unit, a light-emitting unit, a conductive unit and a package unit. The substrate unit has a substrate body, at least one first conductive pad, at least one second conductive pad and at least one chip-placing pad, and the at least one first conductive pad, the at least one second conductive pad and the at least one chip-placing pad are formed on a top surface of the substrate body. The alloy unit has at least one Ni/Pd alloy formed on the at least one chip-placing pad. The light-emitting unit has at least one LED chip positioned on the at least one Ni/Pd alloy of the alloy unit by solidified solder ball or glue. The conductive unit has at least two conductive wires, and the at least one LED chip is electrically connected to the at least one first conductive pad and the at least one second conductive pad by the at least two conductive wires, respectively. The package unit has a light-transmitting package gel body formed on the top surface of the substrate body in order to cover the light-emitting unit and the conductive unit.

To achieve the above-mentioned objectives, the present invention provides an LED package structure for increasing heat-dissipating and light-emitting efficiency, including: a substrate unit, an alloy unit, a light-emitting unit, a conductive unit and a package unit. The substrate unit has a substrate body, at least one first conductive pad and at least one chip-placing pad, and the at least one first conductive pad and the at least one chip-placing pad are formed on a top surface of the substrate body. The alloy unit has at least one Ni/Pd alloy formed on the at least one chip-placing pad. The light-emitting unit has at least one LED chip electrically positioned on the at least one Ni/Pd alloy of the alloy unit by solidified solder ball or glue. The conductive unit has at least one conductive wire, and the at least one LED chip is electrically connected to the at least one first conductive pad by the at least one conductive wire. The package unit has a light-transmitting package gel body formed on the top surface of the substrate body in order to cover the light-emitting unit and the conductive unit.

To achieve the above-mentioned objectives, the present invention provides a method for manufacturing an LED package structure for increasing heat-dissipating and light-emitting efficiency, including: providing a substrate unit that has a substrate body and at least one chip-placing pad formed on a top surface of the substrate body; forming at least one Ni/Pd alloy on the at least one chip-placing pad; placing at least one LED chip on the at least one Ni/Pd alloy via solder ball or glue; solidifying the solder ball or glue to form a solidified solder ball or glue, wherein the at least one LED chip is positioned on the at least one Ni/Pd alloy by the solidified solder ball or glue; electrically connecting the at least one LED chip with the substrate body; and forming a light-transmitting package gel body on the top surface of the substrate body in order to cover the light-emitting unit.

Therefore, because the Ni/Pd alloy is formed on the bottom side of the solidified solder ball or glue, the solidified solder ball or glue cannot react with the chip-placing pad of the substrate body to form an IMC (Intermetallic Compound) that is brittle during reflow process. Hence, when the LED chip is disposed on the solidified solder ball or glue by reflow process, the soldering intensity (joint intensity) between the solidified solder ball or glue and the chip-placing pad of the substrate body can be strengthened. In addition, the alloy unit has another two Ni/Pd alloys (or two Ni/Pd/Au alloys) that are respectively formed on the top surface of the first conductive pad and the top surface of the second conductive pad, so that the conductive unit such as two gold wires are respectively electrically bonded to the one Ni/Pd alloys on the first conductive pad and another Ni/Pd alloys on the second conductive pad.

In order to further understand the techniques, means and effects the present invention takes for achieving the prescribed objectives, the following detailed descriptions and appended drawings are hereby referred, such that, through which, the purposes, features and aspects of the present invention can be thoroughly and concretely appreciated; however, the appended drawings are provided solely for reference and illustration, without any intention that they be used for limiting the present invention.

DETAILED DESCRIPTION OF THE PREFERRED EMBODIMENTS

Figure 1:
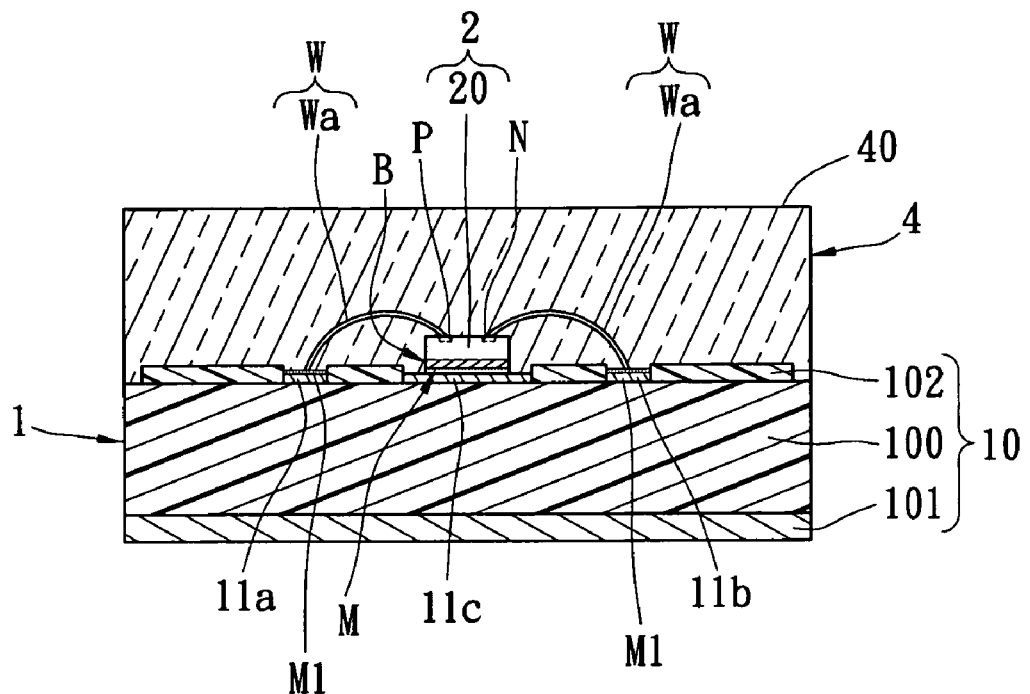
FIG. 1 is a lateral, cross-sectional, schematic view of the LED package structure for increasing heat-dissipating and light-emitting efficiency according to the first embodiment of the present invention.

Referring to FIG. 1, the first embodiment of the present invention provides an LED package structure for increasing heat-dissipating and light-emitting efficiency, including: a substrate unit 1, an alloy unit, a light-emitting unit 2, a conductive unit W and a package unit 4.

The substrate unit 1 has a substrate body 10, at least one first conductive pad 11a, at least one second conductive pad 11b and at least one chip-placing pad 11c, and the first conductive pad 11a, the second conductive pad 11b and the chip-placing pad 11c are formed on a top surface of the substrate body 10. In addition, the chip-placing pad 11c is disposed between the first conductive pad 11a and the second conductive pad 11b, and the first conductive pad 11a, the second conductive pad 11b and the chip-placing pad 11c can be copper foils or any conductive material. Furthermore, the substrate body 10 has a circuit substrate 100, a heat-dissipating layer 101 disposed on a bottom surface of the circuit substrate 100 and an insulative reflecting layer 102 disposed on the top surface of the circuit substrate 100 in order to expose the first conductive pad 11a, the second conductive pad 11b and the chip-placing pad 11c.

Moreover, the alloy unit has at least one Ni/Pd alloy M formed on the chip-placing pad 11c. In addition, the alloy unit has another two Ni/Pd alloys M1 (or two Ni/Pd/Au alloys) that are respectively formed on the top surface of the first conductive pad 11a and the top surface of the second conductive pad 11b, so that the conductive unit W such as two gold wires are respectively electrically bonded to the one Ni/Pd alloys M1 on the first conductive pad 11a and another Ni/Pd alloys M1 on the second conductive pad 11b. In addition, the alloy unit has an Au that can be blended into the Ni/Pd alloy M to form a Ni/Pd/Au alloy according to different requirements. In other words, the Ni/Pd alloy M can be replaced by the Ni/Pd/Au alloy.

Furthermore, the light-emitting unit 2 has at least one LED chip 20 (or many LED chips 20) positioned on the Ni/Pd alloy M of the alloy unit by solidified solder ball or glue B. For example, in the first embodiment, the LED chip 20 has a positive electrode P and a negative electrode N formed on a top surface thereof. Because the Ni/Pd alloy M is formed on the bottom side of the solidified solder ball or glue B, the solidified solder ball or glue B cannot react with the chip-placing pad 11c of the substrate body 10 to form an IMC (Intermetallic Compound) that is brittle during reflow process. Hence, when the LED chip 20 is disposed on the solidified solder ball or glue B by reflow process, the soldering intensity (joint intensity) between the solidified solder ball or glue B and the chip-placing pad 11c of the substrate body 10 can be strengthened.

Besides, the conductive unit W has at least two conductive wires Wa, and the LED chip 20 is electrically connected to the first conductive pad 11a and the second conductive pad 11b by the at least two conductive wires Wa, respectively. For example, in the first embodiment, the two conductive wires Wa are respectively connected between the positive electrode P of the LED chip 20 and the first conductive pad 11a and between the negative electrode N of the LED chip 20 and the second conductive pad 11b.

In addition, the package unit 4 has a light-transmitting package gel body 40 formed on the top surface of the substrate body 10 in order to cover the light-emitting unit 2 and the conductive unit W.

In the first embodiment, the LED chip 20 can be a blue LED chip, and the light-transmitting package gel body 40 can be fluorescent gel. Hence, blue light beams (not shown) generated by the LED chips 20 (the blue LED chips) can pass through the light-transmitting package gel body 40 (the fluorescent gel) to generate white light beams (not shown) that are similar to the light source generate by sun lamp.

The measurement results of the LED package structure of the prior art are shown in the following table, for example the minimum value, maximum value and average value. The present invention provides an electric current of 700 milliampere (mA) for the first embodiment of using the NiPdAu alloy or the NiPd alloy, and the relevant measurement results are shown in the following table:

| Item | Min. value | Max. value | Average value | NiPdAu | NiPd |
|---|---|---|---|---|---|
| Luminous flux | 569.748 | 647.311 | 620.645 | 660.659 | 678.645 |
| Luminous efficiency | 68.038 | 76.777 | 73.596 | 78.991 | 81.27 |
| CIE x | 0.3078 | 0.3207 | 0.3143 | 0.3138 | 0.3131 |
| CIE y | 0.3244 | 0.3511 | 0.3375 | 0.3435 | 0.3452 |
| CCT | 6000.4 | 6819.7 | 6370.8 | 6351.2 | 6373.3 |
| Color render index | 74.235 | 77.196 | 75.624 | 73.894 | 73.308 |

The unit of luminous flux is lumen; the unit of luminous efficiency is lumen/W; CIE x and CIE y respectively are x and y coordinates in xy chromaticity diagram of CIE (International Commission on Illumination); the unit of CCT (Correlated Color Temperature) is Kelvin (K); the unit of color render index is Rendering average (Ra).

In other words, the Ni/Pd alloy M or the Ni/Pd/Au alloy as an interface layer is formed between the solidified solder ball or glue B and the chip-placing pad 11c, so that not only the soldering intensity (joint intensity) between the solidified solder ball or glue B and the chip-placing pad 11c of the substrate body 10 can be strengthened, but also the heat-dissipating efficiency and the light-emitting efficiency are increased as shown in the above-mentioned table. For example, heat generated by the LED chip 20 can be transmitted to the chip-placing pad 11c of the substrate body 10 through the solidified solder ball or glue B and the Ni/Pd alloy M in sequence, so that the heat generated by the LED chip 20 can be dissipated quickly.

Figure 2:
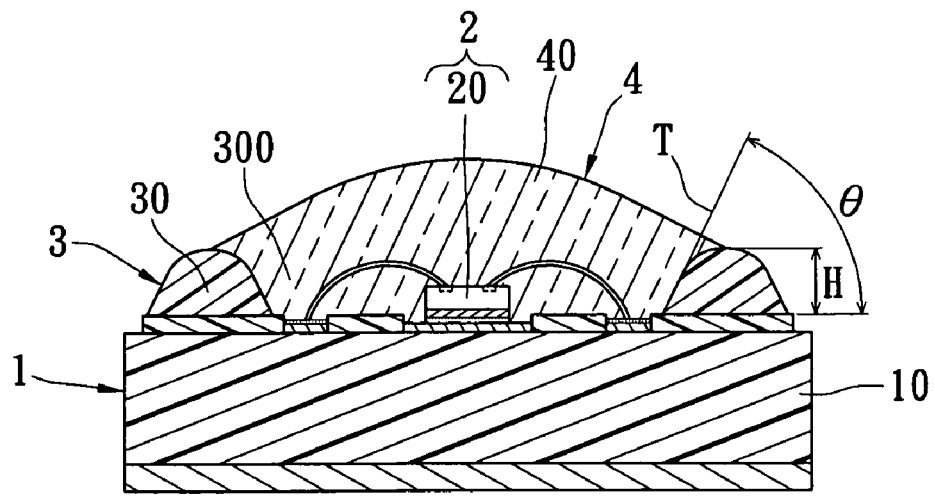
FIG. 2 is a lateral, cross-sectional, schematic view of the LED package structure for increasing heat-dissipating and light-emitting efficiency according to the second embodiment of the present invention.

Referring to FIG. 2, the second embodiment of the present invention provides an LED package structure for increasing heat-dissipating and light-emitting efficiency, including: a substrate unit 1, an alloy unit, a light-emitting unit 2; a conductive unit W, a light-reflecting unit 3 and a package unit 4.

The difference between the second embodiment and the first embodiment is that: the second embodiment further includes a light-reflecting unit 3 that has an annular reflecting gel body 30 surroundingly formed on the top surface of the substrate body 10 by coating. In addition, the annular reflecting gel body 30 surrounds the LED chip 20 to form a gel position limiting space 300 above the substrate body 10, and the position of the light-transmitting package gel body 40 is limited in the gel position limiting space 300.

Moreover, the annular reflecting gel body 30 has an arc shape formed on a top surface thereof. The annular reflecting gel body 30 has a radius tangent T, and the angle θ of the radius tangent T relative to the top surface of the substrate body 10 is between 40° C. and 50° C. The maximum height H of the annular reflecting gel body 30 relative to the top surface of the substrate body 10 is between 0.3 mm and 0.7 mm, and the width of a bottom side of the annular reflecting gel body 30 is between 1.5 mm and 3 mm. The thixotropic index of the annular reflecting gel body 30 is between 4 and 6, and the annular reflecting gel body 30 can be a white thermohardening reflecting body (opaque gel) mixed with inorganic additive.

Figure 3:
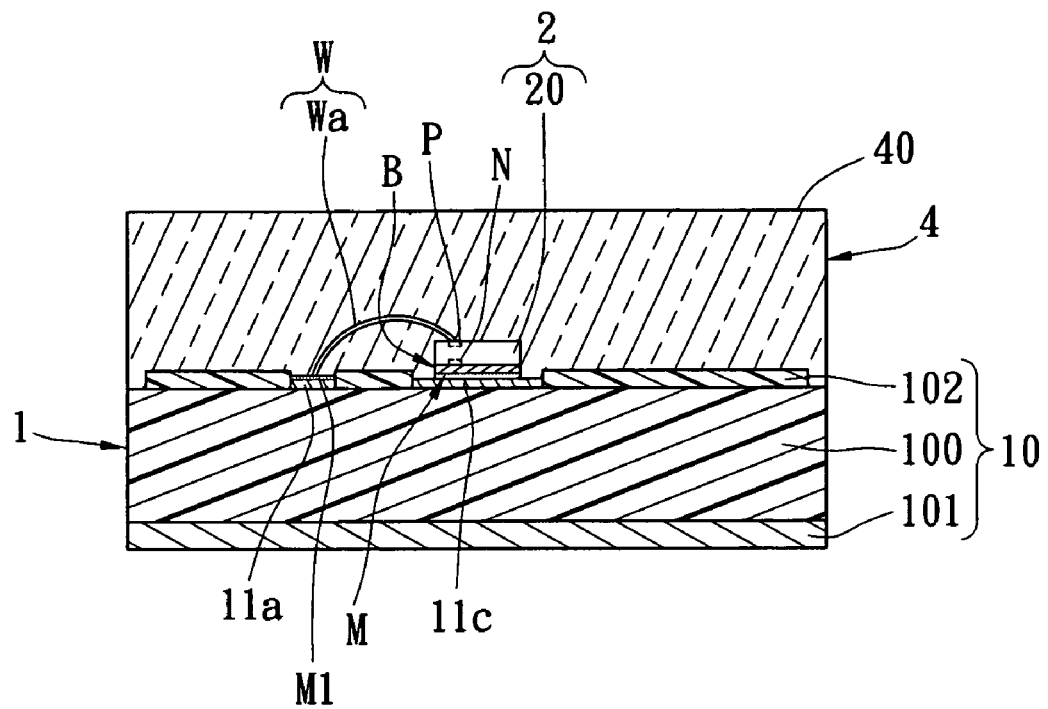
FIG. 3 is a lateral, cross-sectional, schematic view of the LED package structure for increasing heat-dissipating and light-emitting efficiency according to the third embodiment of the present invention.

Referring to FIG. 3, the third embodiment of the present invention provides an LED package structure for increasing heat-dissipating and light-emitting efficiency, including: a substrate unit 1, an alloy unit, a light-emitting unit 2, a conductive unit W and a package unit 4.

The substrate unit 1 has a substrate body 10, at least one first conductive pad 11a and at least one chip-placing pad 11c, and the first conductive pad 11a and the chip-placing pad 11c are formed on a top surface of the substrate body 10. In addition, the chip-placing pad 11c is adjacent to the first conductive pad 11a, and the first conductive pad 11a and the chip-placing pad 11c can be copper foils or any conductive material. Furthermore, the substrate body 10 has a circuit substrate 100, a heat-dissipating layer 101 disposed on a bottom surface of the circuit substrate 100 and an insulative reflecting layer 102 disposed on the top surface of the circuit substrate 100 in order to expose the first conductive pad 11a and the chip-placing pad 11c.

Moreover, the alloy unit has at least one Ni/Pd alloy M formed on the chip-placing pad 11c. In addition, the alloy unit has another Ni/Pd alloy M1 (or another Ni/Pd/Au alloy) that is formed on the top surface of the first conductive pad 11a, so that the conductive unit W such as a gold wire is electrically bonded to the Ni/Pd alloys M1 on the first conductive pad 11a. In addition, the alloy unit has an Au that can be blended into the Ni/Pd alloy M to form a Ni/Pd/Au alloy according to different requirements. In other words, the Ni/Pd alloy M can be replaced by the Ni/Pd/Au alloy.

Furthermore, the light-emitting unit 2 has at least one LED chip 20 (or many LED chips 20) electrically positioned on the Ni/Pd alloy M of the alloy unit by solidified solder ball or glue B. For example, in the third embodiment, the LED chip 20 has a top electrode P and a bottom electrode N respectively formed on a top surface and a bottom surface thereof. Because the Ni/Pd alloy M is formed on the bottom side of the solidified solder ball or glue B, the solidified solder ball or glue B cannot react with the chip-placing pad 11c of the substrate body 10 to form an IMC (Intermetallic Compound) that is brittle during reflow process. Hence, when the LED chip 20 is disposed on the solidified solder ball or glue B by reflow process, the soldering intensity (joint intensity) between the solidified solder ball or glue B and the chip-placing pad 11c of the substrate body 10 can be strengthened.

Besides, the conductive unit W has at least one conductive wire Wa, and the LED chip 20 is electrically connected to the first conductive pad 11a by the conductive wire Wa. For example, in the third embodiment, the bottom electrode N is electrically connected to the chip-placing pad 11c by the solidified solder ball or glue B and the Ni/Pd alloy M, and the top electrode P is electrically connected to the first conductive pad 11a by the conductive wire Wa.

In addition, the package unit 4 has a light-transmitting package gel body 40 formed on the top surface of the substrate body 10 in order to cover the light-emitting unit 2 and the conductive unit W.

In the third embodiment, the LED chip 20 can be a blue LED chip, and the light-transmitting package gel body 40 can be fluorescent gel. Hence, blue light beams (not shown) generated by the LED chips 20 (the blue LED chips) can pass through the light-transmitting package gel body 40 (the fluorescent gel) to generate white light beams (not shown) that are similar to the light source generate by sun lamp.

Figure 4:
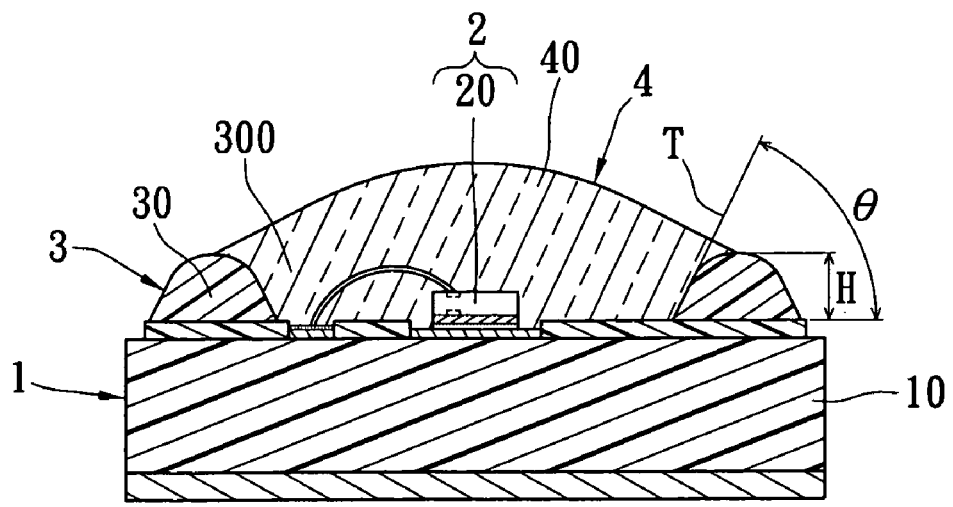
FIG. 4 is a lateral, cross-sectional, schematic view of the LED package structure for increasing heat-dissipating and light-emitting efficiency according to the fourth embodiment of the present invention.

Referring to FIG. 4, the fourth embodiment of the present invention provides an LED package structure for increasing heat-dissipating and light-emitting efficiency, including: a substrate unit 1, an alloy unit, a light-emitting unit 2, a conductive unit W, a light-reflecting unit 3 and a package unit 4.

The difference between the fourth embodiment and the third embodiment is that: the fourth embodiment further includes a light-reflecting unit 3 that has an annular reflecting gel body 30 surroundingly formed on the top surface of the substrate body 10 by coating. In addition, the annular reflecting gel body 30 surrounds the LED chip 20 to form a gel position limiting space 300 above the substrate body 10, and the position of the light-transmitting package gel body 40 is limited in the gel position limiting space 300.

Moreover, the annular reflecting gel body 30 has an arc shape formed on a top surface thereof. The annular reflecting gel body 30 has a radius tangent T, and the angle θ of the radius tangent T relative to the top surface of the substrate body 10 is between 40° C. and 50° C. The maximum height H of the annular reflecting gel body 30 relative to the top surface of the substrate body 10 is between 0.3 mm and 0.7 mm, and the width of a bottom side of the annular reflecting gel body 30 is between 1.5 mm and 3 mm. The thixotropic index of the annular reflecting gel body 30 is between 4 and 6, and the annular reflecting gel body 30 can be a white thermohardening reflecting body (opaque gel) mixed with inorganic additive.

Figure 5:
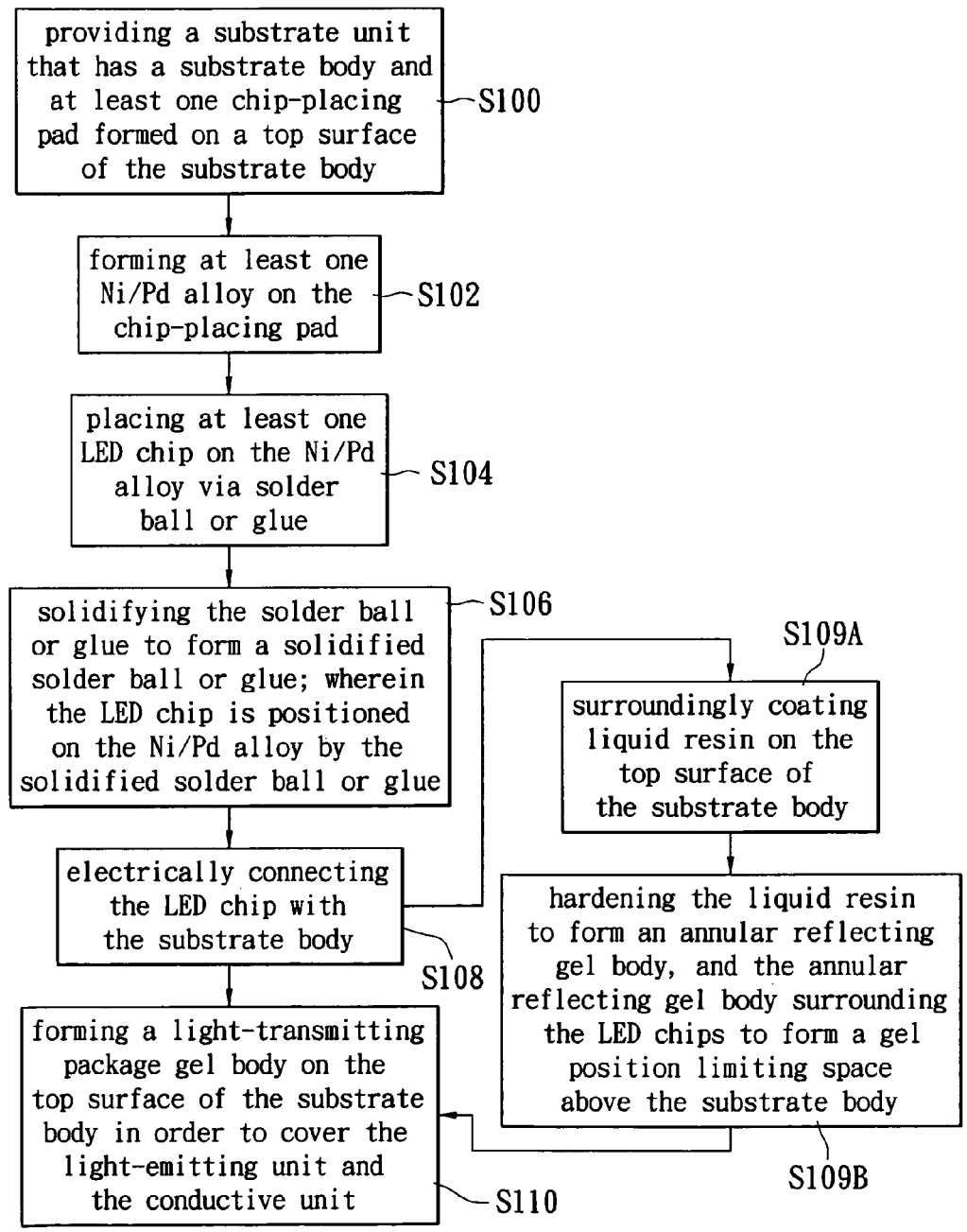
FIG. 5 is a flowchart of the method for manufacturing an LED package structure for increasing heat-dissipating and light-emitting efficiency according to the present invention.

Referring to FIG. 5, the present invention provides a method for manufacturing an LED package structure for increasing heat-dissipating and light-emitting efficiency, including: providing a substrate unit 1 that has a substrate body 10 and at least one chip-placing pad 10c formed on a top surface of the substrate body 10 (the step S100); forming at least one Ni/Pd alloy M on the chip-placing pad 11c (the step S102); placing at least one LED chip 20 on the Ni/Pd alloy M via solder ball or glue (the step S104); solidifying the solder ball or glue to form a solidified solder ball or glue B (for example using reflow process), wherein the LED chip 20 is positioned on the Ni/Pd alloy M by the solidified solder ball or glue B (the step S106); electrically connecting the LED chip 20 with the substrate body 10 (the step S108); and then forming a light-transmitting package gel body 40 on the top surface of the substrate body 10 in order to cover the light-emitting unit 3 and the conductive unit W (the step S110).

Hence, the first embodiment and the second embodiment of the present invention can be manufactured by the above-mentioned method. For example, in the first embodiment, the two top electrodes (P, N) of the LED chip 20 are electrically connected to the first conductive pad 11a and the second conductive pad 11b by the at least two conductive wires Wa, respectively. In the third embodiment, the bottom electrode N of the LED chip 20 is electrically disposed on the Ni/Pd alloy M by the solidified solder ball or glue B, and the top electrode. P of the LED chip 20 is electrically connected to the first conductive pad 11a by the conductive wire Wa.

Furthermore, according to different requirements, before forming the light-transmitting package gel body 40 on the top surface of the substrate body 10, the method further includes: surroundingly coating liquid resin (not shown) on the top surface of the substrate body 10 (step S109A). In addition, the liquid resin can be coated on the substrate body 10 by any shapes according to different requirements (such as a circular shape, a square or a rectangular shape etc.). The thixotropic index of the liquid resin is between 4 and 6, the pressure of coating the liquid resin on the top surface of the substrate body 10 is between 350 kpa and 450 kpa, and the velocity of coating the liquid resin on the top surface of the substrate body 10 is between 5 mm/s and 15 mm/s. The liquid resin is surroundingly coated on the top surface of the substrate body 10 from a start point to a termination point, and the position of the start point and the position of the termination point are the same. Furthermore, after the step S109A, the method includes hardening the liquid resin to form an annular reflecting gel body 30, and the annular reflecting gel body 30 surrounding the LED chips 20 to form a gel position limiting space 300 above the substrate body 10 (step S109B). In addition, the liquid resin is hardened by baking, the baking temperature is between 120° C. and 140° C., and the baking time is between 20 minute and 40 minute.

In conclusion, because the Ni/Pd alloy is formed on the bottom side of the solidified solder ball or glue, the solidified solder ball or glue cannot react with the chip-placing pad of the substrate body to form an IMC (Intermetallic Compound) that is brittle during reflow process. Hence, when the LED chip is disposed on the solidified solder ball or glue by reflow process, the soldering intensity (joint intensity) between the solidified solder ball or glue and the chip-placing pad of the substrate body can be strengthened. In addition, the alloy unit has another two Ni/Pd alloys (or two Ni/Pd/Au alloys) that are respectively formed on the top surface of the first conductive pad and the top surface of the second conductive pad, so that the conductive unit such as two gold wires are respectively electrically bonded to the one Ni/Pd alloys on the first conductive pad and another Ni/Pd alloys on the second conductive pad.

The above-mentioned descriptions merely represent solely the preferred embodiments of the present invention, without any intention or ability to limit the scope of the present invention which is fully described only within the following claims. Various equivalent changes, alterations or modifications based on the claims of present invention are all, consequently, viewed as being embraced by the scope of the present invention.

What is claimed is:

1. An LED package structure for increasing heat-dissipating and light-emitting efficiency, comprising:
a substrate unit having a substrate body, at least one first conductive pad, at least one second conductive pad and at least one chip-placing pad, wherein the at least one first conductive pad, the at least one second conductive pad and the at least one chip-placing pad are formed on a top surface of the substrate body;
an alloy unit having at least one Ni/Pd alloy formed on the at least one chip-placing pad;
a light-emitting unit having at least one LED chip positioned on the at least one Ni/Pd alloy of the alloy unit by solidified solder ball or glue;
a conductive unit having at least two conductive wires, wherein the at least one LED chip is electrically connected to the at least one first conductive pad and the at least one second conductive pad by the at least two conductive wires, respectively;
a package unit having a light-transmitting package gel body formed on the top surface of the substrate body to cover the light-emitting unit and the conductive unit; and
a light-reflecting unit having an annular reflecting gel body surroundingly formed on the top surface of the substrate body by coating, wherein the annular reflecting gel body surrounds the at least one LED chip to limit the light-transmitting package gel body formed on the at least one LED chip.

2. The LED package structure according to claim 1, wherein the annular reflecting gel body has an arc shape formed on a top surface thereof, the annular reflecting gel body has a radius tangent and the angle of the radius tangent relative to the top surface of the substrate body is between 40° and 50°, the maximum height of the annular reflecting gel body relative to the top surface of the substrate body is between 0.3 mm and 0.7 mm, the width of a bottom side of the annular reflecting gel body is between 1.5 mm and 3 mm, the thixotropic index of the annular reflecting gel body is between 4 and 6, and the annular reflecting gel body is a white thermohardening reflecting body mixed with inorganic additive.

3. The LED package structure according to claim 1, wherein the substrate body has a circuit substrate, a heat-dissipating layer disposed on a bottom surface of the circuit substrate and an insulative reflecting layer disposed on the top surface of the circuit substrate in order to expose the at least one first conductive pad, the at least one second conductive pad and the at least one chip-placing pad, and the at least one first conductive pad, the at least one second conductive pad and the at least one chip-placing pad are copper foils.

4. The LED package structure according to claim 1, wherein the alloy unit has another two Ni/Pd alloys or two Ni/Pd/Au alloys that are respectively formed on the at least one first conductive pad and the at least one second conductive pad.

5. The LED package structure according to claim 1, wherein the at least one LED chip is a blue LED chip, and the light-transmitting package gel body is fluorescent gel.

6. The LED package structure according to claim 1, wherein the at least one LED chip has a positive electrode and a negative electrode formed on a top surface thereof, and the at least two conductive wires are respectively electrically connected between the positive electrode and the at least one first conductive pad and between the negative electrode and the at least one second conductive pad.

7. The LED package structure according to claim 1, wherein the alloy unit has an Au blended into the at least one Ni/Pd alloy to form a Ni/Pd/Au alloy.

8. An LED package structure for increasing heat-dissipating and light-emitting efficiency, comprising:
a substrate unit having a substrate body, at least one first conductive pad and at least one chip-placing pad, wherein the at least one first conductive pad and the at least one chip-placing pad are formed on a top surface of the substrate body;
an alloy unit having at least one Ni/Pd alloy formed on the at least one chip-placing pad;
a light-emitting unit having at least one LED chip electrically positioned on the at least one Ni/Pd alloy of the alloy unit by solidified solder ball or glue;
a conductive unit having at least one conductive wire, wherein the at least one LED chip is electrically connected to the at least one first conductive pad by the at least one conductive wire;
a package unit having a light-transmitting package gel body formed on the top surface of the substrate body to cover the light-emitting unit and the conductive unit; and
a light-reflecting unit having an annular reflecting gel body surroundingly formed on the top surface of the substrate body by coating, wherein the annular reflecting gel body surrounds the at least one LED chip to limit the light-transmitting package gel body formed on the at least one LED chip.

9. The LED package structure according to claim 8, wherein the annular reflecting gel body has an arc shape formed on a top surface thereof, the annular reflecting gel body has a radius tangent and the angle of the radius tangent relative to the top surface of the substrate body is between 40° and 50°, the maximum height of the annular reflecting gel body relative to the top surface of the substrate body is between 0.3 mm and 0.7 mm, the width of a bottom side of the annular reflecting gel body is between 1.5 mm and 3 mm, the thixotropic index of the annular reflecting gel body is between 4 and 6, and the annular reflecting gel body is a white thermohardening reflecting body mixed with inorganic additive.

10. The LED package structure according to claim 8, wherein the substrate body has a circuit substrate, a heat-dissipating layer disposed on a bottom surface of the circuit substrate and an insulative reflecting layer disposed on the top surface of the circuit substrate in order to expose the at least one first conductive pad and the at least one chip-placing pad, and the at least one first conductive pad and the at least one chip-placing pad are copper foils.

11. The LED package structure according to claim 8, wherein the alloy unit has another Ni/Pd alloy or a Ni/Pd/Au alloy that is formed on the at least one first conductive pad.

12. The LED package structure according to claim 8, wherein the at least one LED chip is a blue LED chip, and the light-transmitting package gel body is fluorescent gel.

13. The LED package structure according to claim 8, wherein the at least one LED chip has a top electrode and a bottom electrode respectively formed on a top surface and a bottom surface thereof, the bottom electrode is electrically connected to the at least one chip-placing pad by the solidified solder ball or glue and the at least one Ni/Pd alloy, and the top electrode is electrically connected to the at least one first conductive pad by the at least one conductive wire.

14. The LED package structure according to claim 8, wherein the alloy unit has an Au blended into the at least one Ni/Pd alloy to form a Ni/Pd/Au alloy.

15. A method for manufacturing an LED package structure for increasing heat-dissipating and light-emitting efficiency, comprising:
providing a substrate unit that has a substrate body and at least one chip-placing pad formed on a top surface of the substrate body;
forming at least one Ni/Pd alloy on the at least one chip-placing pad;
placing at least one LED chip on the at least one Ni/Pd alloy via solder ball or glue;
solidifying the solder ball or glue to form a solidified solder ball or glue, wherein the at least one LED chip is positioned on the at least one Ni/Pd alloy by the solidified solder ball or glue;
electrically connecting the at least one LED chip with the substrate body; surroundingly coating liquid resin on the top surface of the substrate body and curing the liquid resin to form an annular reflecting gel body to surround the at least one LED chip; and
forming a light-transmitting package gel body on the top surface of the substrate body to cover the at least one LED chip, wherein the light-transmitting package gel body is limited on the at least one LED chip by the annular reflecting gel body.

16. The method according to claim 15, wherein the substrate unit has at least one first conductive pad and at least one second conductive pad both on the top surface of the substrate body, the at least one LED chip has a positive electrode and a negative electrode formed on a top surface thereof, and at least two conductive wires respectively electrically connected between the positive electrode and the at least one first conductive pad and between the negative electrode and the at least one second conductive pad.

17. The method according to claim 15, wherein the substrate unit has at least one first conductive pad on the top surface of the substrate body, the at least one LED chip has a top electrode and a bottom electrode respectively formed on a top surface and a bottom surface thereof, the bottom electrode is electrically connected to the at least one chip-placing pad by the solidified solder ball or glue and the at least one Ni/Pd alloy, and the top electrode is electrically connected to the at least one first conductive pad by at least one conductive wire.

* * * * *